(12) United States Patent
Asao

(10) Patent No.: US 6,325,642 B2
(45) Date of Patent: Dec. 4, 2001

(54) ELECTRICAL CONNECTION BOX

(75) Inventor: Takahiro Asao, Yokkaichi (JP)

(73) Assignee: Sumitomo Wiring Systems, Ltd., Mie (JP)

(*) Notice: Subject to any disclaimer, the term of this patent is extended or adjusted under 35 U.S.C. 154(b) by 0 days.

(21) Appl. No.: 09/727,698

(22) Filed: Dec. 4, 2000

(30) Foreign Application Priority Data

Dec. 3, 1999 (JP) .................................................. 11-344812

(51) Int. Cl.[7] .............................. H05K 1/00; H01R 9/22; H01R 13/73
(52) U.S. Cl. ........................................... 439/76.2; 439/949
(58) Field of Search .................................. 439/76.2, 404, 439/856, 857, 949

(56) References Cited

U.S. PATENT DOCUMENTS 5,759,050 * 6/1998 Matsuoka et al. .................. 439/76.2

FOREIGN PATENT DOCUMENTS

A-10-178286  6/1998 (JP).

* cited by examiner

Primary Examiner—Tulsidas Patel
Assistant Examiner—Chandrika Prasad
(74) Attorney, Agent, or Firm—Oliff & Berridge, PLC

(57) ABSTRACT

An electrical connection box is equipped with a bus bar laminate composed of bus bars and insulation layers, and a printed circuit board electrically connected with the bus bar laminate. First ends of connecting terminals are soldered to conductors of the circuit board. Connection tabs are provided by bending up parts of the bus bar. An insertion groove is provided in the end parts of each male tab, or in the second end of each connecting terminals, with the other thereof being inserted into and held in the insertion grooves. Therefore, reliable and economic connection is obtained.

7 Claims, 5 Drawing Sheets

ELECTRICAL CONNECTION BOX

RELATED APPLICATION

This application is related to co-pending U.S. application Ser. No. 09/575,679, filed on Jun. 28, 2000 by the present inventor. The disclosure of U.S. application Ser. No. 09/575,679 is hereby incorporated herein by reference in its entirety.

BACKGROUND OF THE INVENTION

1. Field of Invention

The present invention relates to an electrical connection box suitable to be mounted on, for example, an automobile or other vehicle, and more specifically relates to a connecting structure for a printed circuit board and a bus bar laminate in the electric connection box.

2. Description of Related Art

As described in the "Description of Related Art" section of co-pending U.S. application Ser. No. 09/575,679, which is incorporated herein by reference, conventional electrical connecting boxes have various problems such as impaired connection reliability between a printed circuit board and a bus bar laminate, and the formation of "dead areas" occupied by connectors. Better electrical connection boxes are needed to address these problems.

SUMMARY OF THE INVENTION

An example of an electrical connection box suitable to be mounted in an automobile or the like is shown in FIG. 7. The box 41 is equipped with a bus bar laminate 44 composed of bus bars 42 and insulator layers 43, and a printed circuit board 45 having a function of an ECU (electronic control unit). Various electrical parts 46 are mounted on one face of the printed circuit board 45. Terminals of these electrical parts 46 are soldered in the plated through-holes of the board 45.

A pair of housings 47 is provided on the uppermost insulator layer 43, and connectors 48 of bent sheet metal are held in the housings 47. Male tabs 42a formed by bending up portions of the bus bars 42 are inserted and held in the lower opening parts of the respective connectors 48. Connecting terminals 50 are partially molded in resin blocks 49, and their first ends 50a are soldered to the plated through-holes of the circuit board 45. The second ends 50b of the respective connecting terminals 50 are inserted and held in the upper opening parts of the connectors 48. In this way, the circuit board 45 and the bus bar laminate 44 are electrically connected.

However, when the number of parts is large, the number of steps needed for assembly increases, because a large number of the connectors 48 are required in this electrical connection box 41. Accordingly, this has resulted in complication of structure, cost increase of products, and weight increase of products.

The present invention has an object to provide an electrical connection box containing a printed circuit board and a bus bar laminate, which can have a simple structure and can be of low cost and light weight.

According to the invention there is provided an electrical connection box comprising a bus bar laminate having at least one bus bar and at least one insulation layer laminated together, and a printed circuit board. A plurality of connection terminals have first ends connected by soldering to the printed circuit board, and second ends remote from the first ends. The bus bar laminate has a plurality of upstanding connection tabs formed by bending portions of at least one of the bus bars. Respective pairs of the connection terminals and the connection tabs are connected together, to establish electrical connection between the bus bar laminate and the printed circuit board. This electrical connection is accomplished using an insertion groove provided in either the connection tab or the second end of the connection terminal, with the other thereof being inserted into and held in the insertion groove.

Preferably the box has at least one molded block of resin material in which a plurality of the connection terminals are held spaced apart by insert molding with their ends exposed outside the molded block. Preferably, in this case, on the bus bar laminate, there is at least one housing composed of insulation material upstanding towards the printed circuit board, containing a plurality of the connection tabs and having an outer end against which the molded resin block abuts.

BRIEF DESCRIPTION OF THE DRAWINGS

Embodiments of the invention will now be described by way of non-limitative example with reference to the accompanying drawings, in which.

DETAILED DESCRIPTION OF THE EMBODIMENTS

Figure 1:
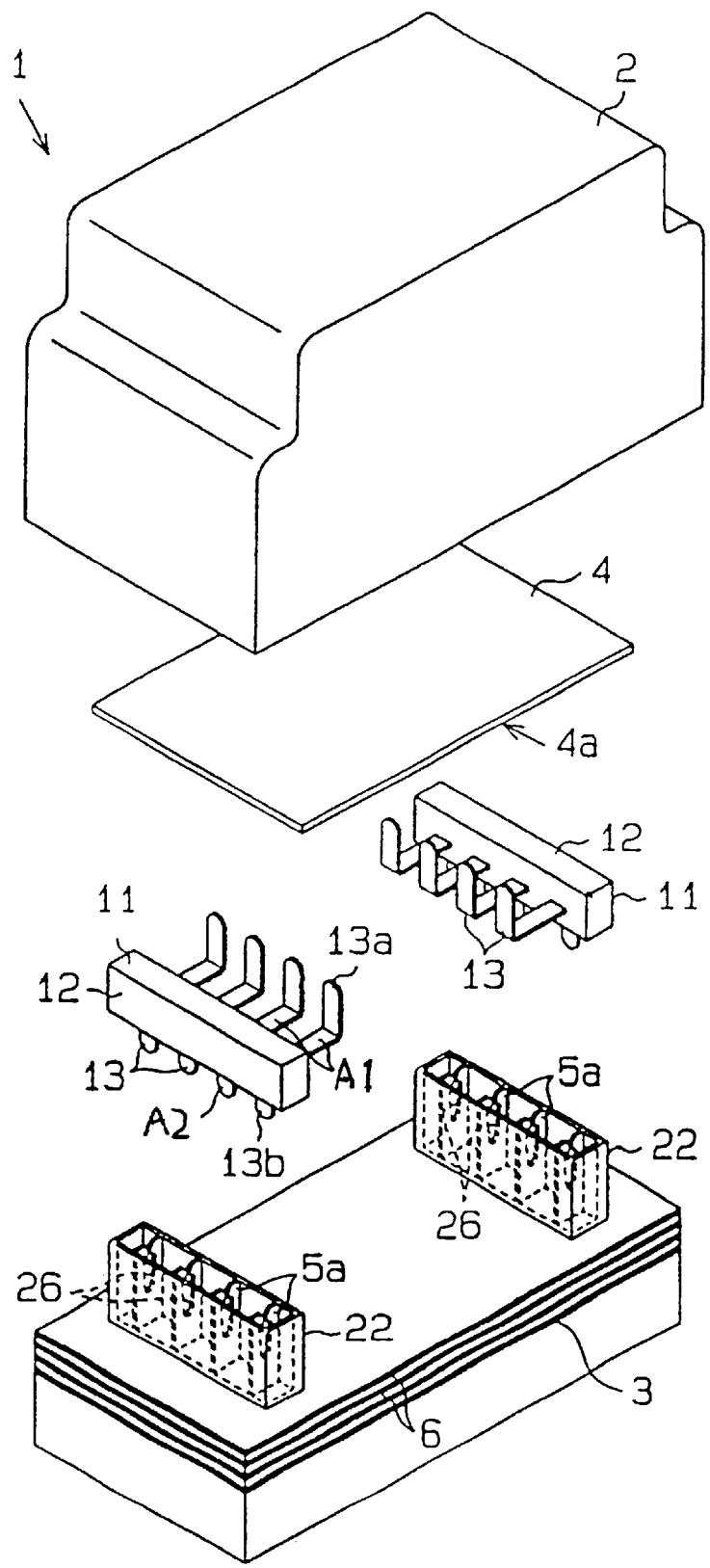
FIG. 1 is an exploded schematic perspective view of the electrical connection box in one embodiment of the present invention.

An electrical connection box 1 of the present invention, suitable to be mounted in an automobile, is illustrated in detail in FIGS. 1 to 4. The electrical connection box 1 has a bus bar laminate 3 and a printed circuit board 4 having a function of an ECU unit mounted in an upper case 2 made of suitable molded polymeric resin.

The bus bar laminate 3 has an approximately rectangular shape as a whole and is formed by alternatively laminating bus bars 5 composed of electro-conductive metal sheet and insulation layers 6 made of a resin. Connection tabs 5a are provided at desired locations by bending portions of these bus bars 5 upwardly. The bus bar laminate 3 is arranged at an opening of the upper case 2. A lower case 7, also made of suitable resin, is fitted to the upper case 2.

Figure 2:
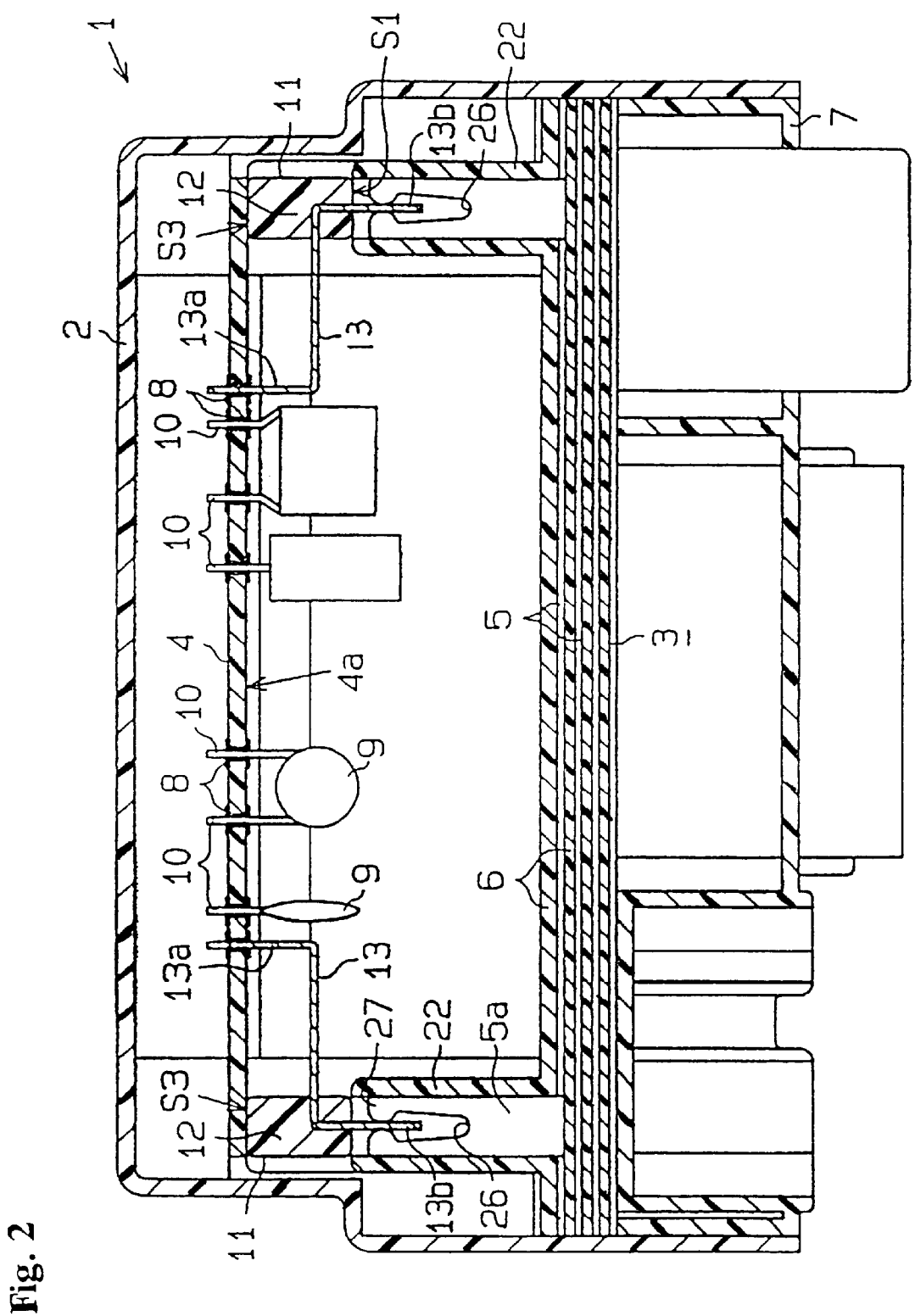
FIG. 2 is a sectional view of the electrical connection box of FIG. 1.

The printed circuit board 4 may have a rectangular shape and may be of smaller size than the bus bar laminate 3. The circuit board 4 in the present embodiment is a double face plate having conductor patterns on both faces, which are mutually connected through the plated through-holes 8, into which connection pins can be inserted. In FIGS. 1 and 2, various electronic parts 9 (e.g., IC packages, resistances, capacitors and the like) are mounted on one face 4a of the printed circuit board 4. Each of these electronic parts 9 has a plurality of terminals 10. The respective terminals 10 are inserted and soldered in the corresponding plated through-holes 8.

Next, a structure connecting the printed circuit board 4 with the bus bar laminate 3 is described. Electrical connection between these two is provided by the molded connection articles 11, which are provided in the electrical connection box 1. The molded connection articles 11 are arranged at two spaced locations at the parts-mounting face 4a of the print circuit board 4.

Figure 3:
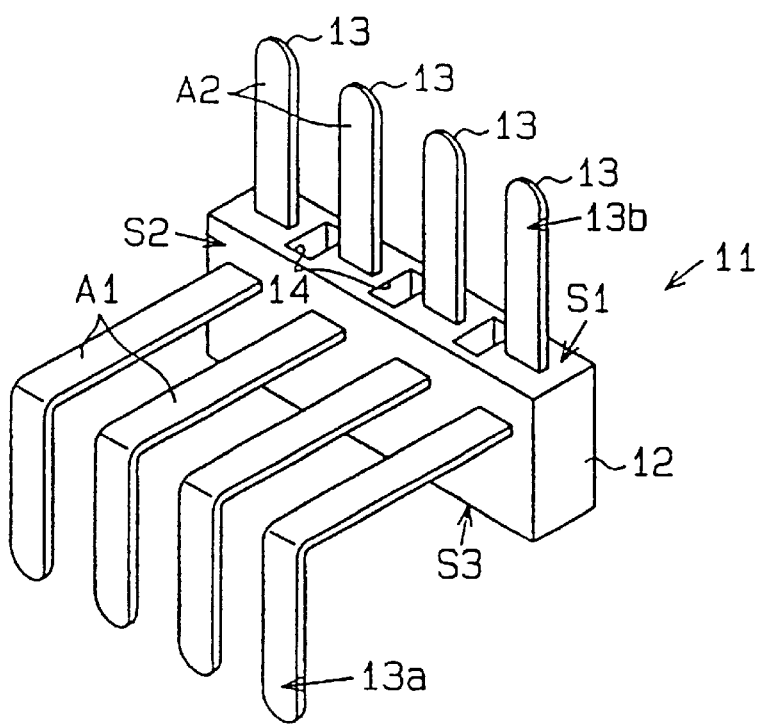
FIG. 3 is a perspective view of the molded connection articles used in the electrical connection box of FIG. 1.

As shown in FIG. 3, each molded connection article 11 has a plurality of connecting terminals 13 (e.g., four) partially molded in resin blocks 12. The resin blocks 12, which in this example have an elongated rectangular parallelepiped shape, are made of a resin molding material (for example, an epoxy or the like) having insulating property and heat resistance. As shown in FIG. 2, faces S3 of the resin blocks 12 abut the parts-mounting face 4a of the printed circuit board 4, and it is preferred that the faces S3 and the parts-mounting face 4a are not adhered together by an adhesive or the like. Accordingly, it may also be understood that the parts mounting face 4a is supported by the faces S3 of the resin blocks 12, though preferably not adhered.

The four connecting terminals 13 in each block 12 are made of a sheet electro-conductive metal material similar to that of the bus bars 5, in the present embodiment. Each terminal 13 is retained, preferably parallel and equally spaced from its neighbours, by insert molding in the resin blocks 12. As shown in FIG. 3, second end parts A2 of the terminals 13 are linear and protrude perpendicularly from a face S1 of the resin blocks 12. On the other hand, exposed first end parts A1 are rectangularly bent and protrude from a side face S2 of the resin block 12. Mold shrink protection holes 14 are formed between the respective connecting terminals 13, in the face S1. Within the resin block 12 each terminal 13 is also rectangularly bent.

As shown in FIG. 2, the first ends 13a of the first end parts A1 of the terminals 13 are inserted and soldered in the plated through-holes 8 of the circuit board 4. The first end parts A1 are inserted in the plated through-holes 8 in the same direction as the terminals 10 of the other electronic parts 9.

Figure 4A:
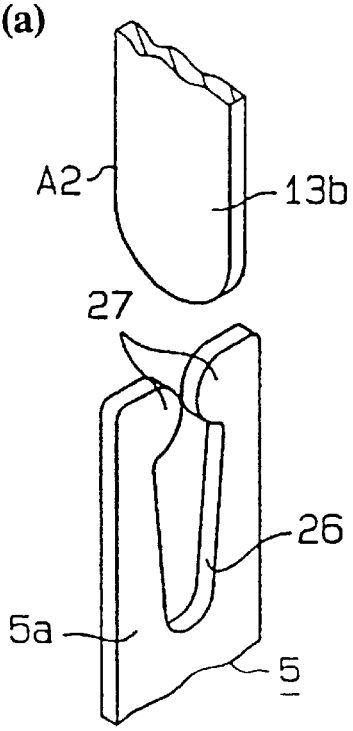
FIGS. 4(a) and 4(b) are enlarged perspective views of a second end of a connecting terminal and the end part of male tab shown in the box of FIG. 1.

As shown in FIG. 1, upstanding housings 22 are provided as required at spaced locations of the insulation layer 6, which is situated on the uppermost bus bar layer in the laminate 3. Specifically, these housings 22 correspond in location with the molded connection articles 11 attached to the printed circuit board 4. These housings 22 are integrally formed with the uppermost insulation layer 6 by molding, using a synthetic resin as a material, as a rectangular box open at the upper end face. A plurality of the tabs 5a (e.g., four) stand upright in the inner cavity, which may have a rectangular parallelepiped shape, for example, of each housing 22. The tabs 5a may be mutually parallel and equally spaced. As shown in FIG. 4a, the ends of the tabs 5a have insertion grooves 26 which extend in their longitudinal direction (the up-and-down direction of FIG. 4a). In this embodiment, the grooves 26 have a V-shape or a U-shape, with a pair of opposed semicircular protrusions 27 at the upper ends of the inner sides of the grooves 26. The gap between the pair of protrusions 27 is slightly narrower than the plate thickness of the connecting terminals 13.

Figure 4B:
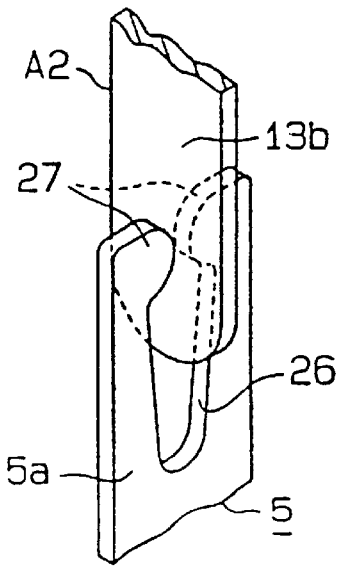

As shown in FIG. 4b, the ends 13b of the second end parts A2 of the connecting terminals 13 are frictionally held by being inserted in the insertion grooves 26. The springiness of the material of the tabs 5a ensures a pressure contact between the protrusions 27 and the terminals 13. At their connection zone, the tab 5a and the end 13b of the terminal lie in orthogonal planes. The printed circuit board 4 and the bus bar laminate 3 are thus electrically connected. Further, the face S1 of the block 12 where the second end parts A2 protrude is in contact with and supported by the upper end faces of the housings 22, as shown in FIG. 2.

The following advantages can be obtained in this embodiment.

Figure 7:
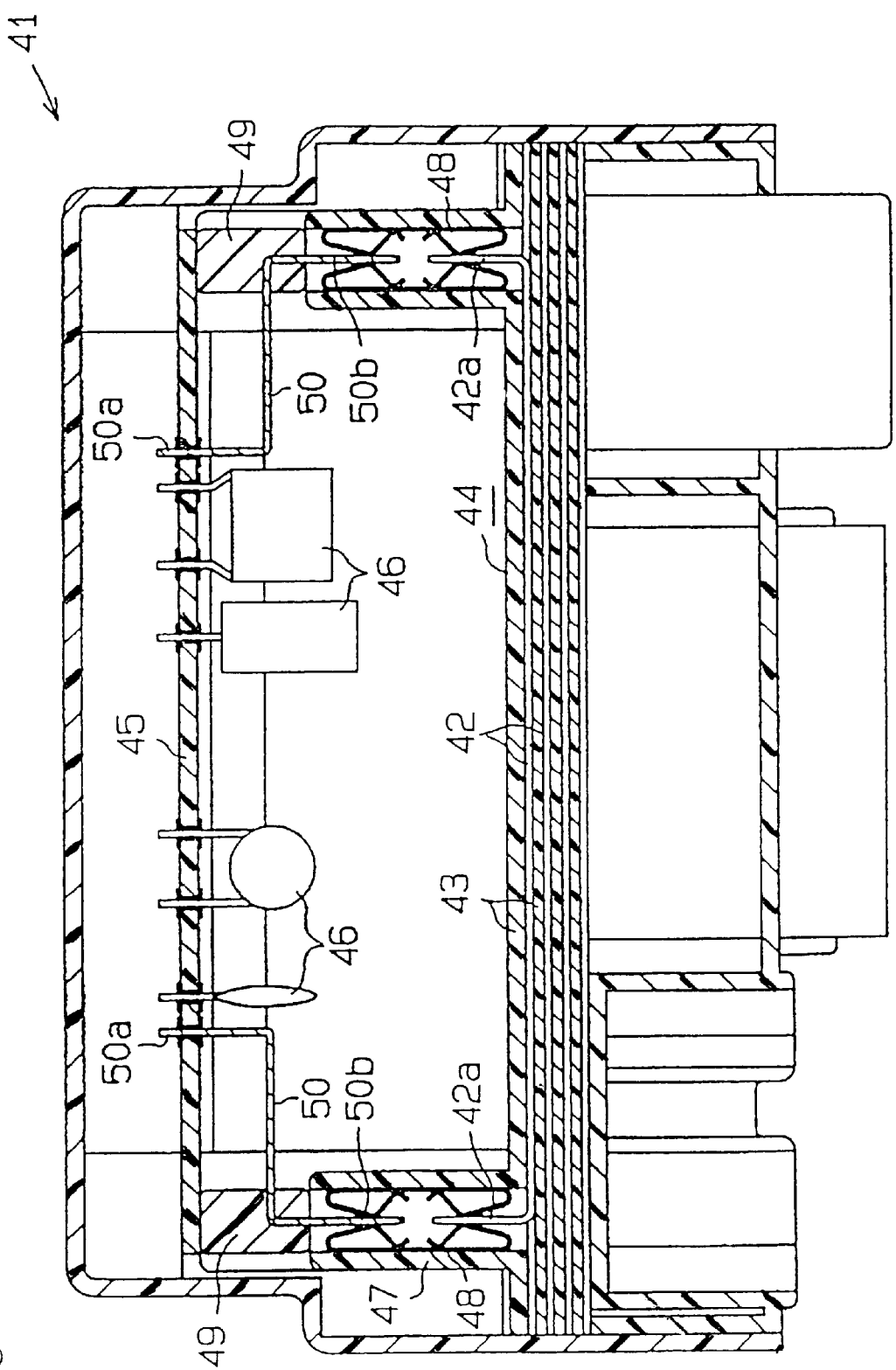
FIG. 7 is a sectional view showing a conventional electrical connection box.

(1) The second ends 13b of the respective connecting terminals 13 are inserted and fixed in the insertion grooves 26 at the ends of the respective tabs 5a. Therefore, the circuit board 4 and the bus bar laminate 3 can be electrically connected through only the molded connection articles 11. Accordingly, the large number of connections which have previously been required, such as connectors 48 in FIG. 7, is unnecessary. Therefore, the number of parts can be reduced, and the number of assembly steps can be reduced accordingly. Low cost of the electrical connection box 1 can be achieved, and it has a simple structure and low weight.

(2) A plurality of the connecting terminals 13 are molded in mutually fixed positions in the resin blocks 12 with both end parts exposed. Therefore, troublesome work of soldering connecting terminals by positioning them one-by-one is unnecessary. Accordingly, the soldering work on the printed circuit board 4 is easy, and the assembly of the electrical connection box 1 is simple.

(3) The tabs 5a are arranged in the housings 22 provided on the insulation layer 6, so that the connection between the tabs 5a and the connecting terminals 13 are protected by the housings 22. Accordingly, resistance to shock and vibration is enhanced. Further, the waterproofing of the connections is enhanced because the connections are not exposed. Therefore, the reliability of the device can be improved.

(4) Further, the face S1 on the resin blocks 12 where the second ends 13b protrude is supported in contact with the upper end faces of the housings 22. Therefore, the printed circuit board can be horizontally and securely held at a fixed height. This also contributes to the improvement of the reliability of the device.

(5) The first ends 13a of the terminals 13 are fixed by soldering them in the plated through-holes 8 of the printed circuit board 4. Therefore, deviation of the position of the respective terminals 13 is minimized, and deterioration of the reliability of connection between the printed circuit board 4 and the bus bar laminate 3 can be prevented.

(6) In this embodiment, the insertion grooves 26 are provided not on the connecting terminals 13 but on the male tabs 5a. Therefore, it is unnecessary to use wide connecting terminals 13 to allow for the formation of the insertion grooves 26, and narrow connecting terminals 13 can be used.

Some possible modifications of this embodiment of the present invention will be discussed below.

Figure 5:
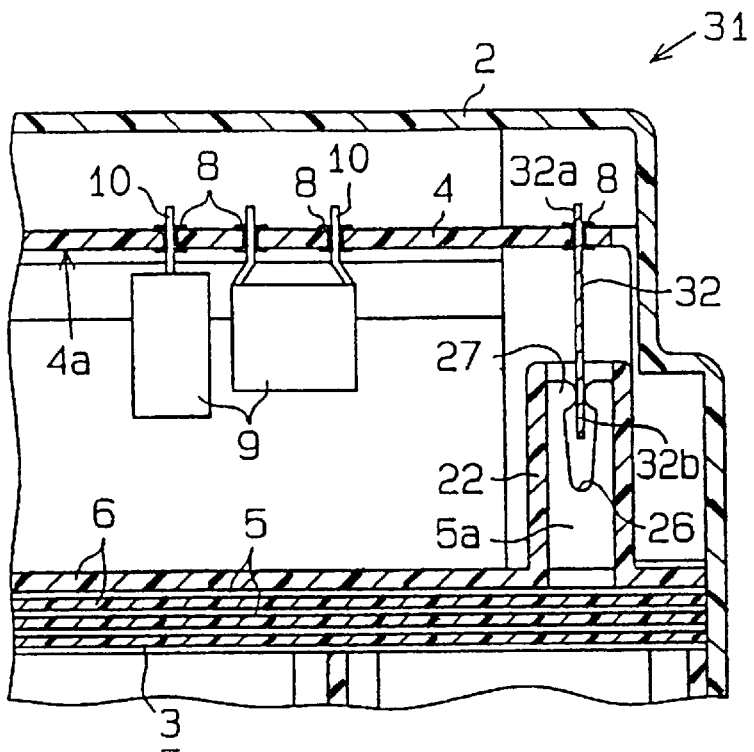
FIG. 5 is a partial sectional view showing another embodiment of the electrical connection box of the invention.

Connecting terminals 32 which are not molded in the resin blocks and are of simpler shape may be used instead of the connection article 11, as shown in the electrical connection box 31 of a second embodiment which is shown in FIG. 5. The first ends 32a of the planar connecting terminals 32 are soldered in the plated through-holes 8, and the second ends 32b are inserted in the insertion grooves 26 of the tabs 5a. The structure can thus be simplified in comparison with that of FIGS. 1 to 4. Reduction of product cost and the weight of the product can be attained.

Figure 6:
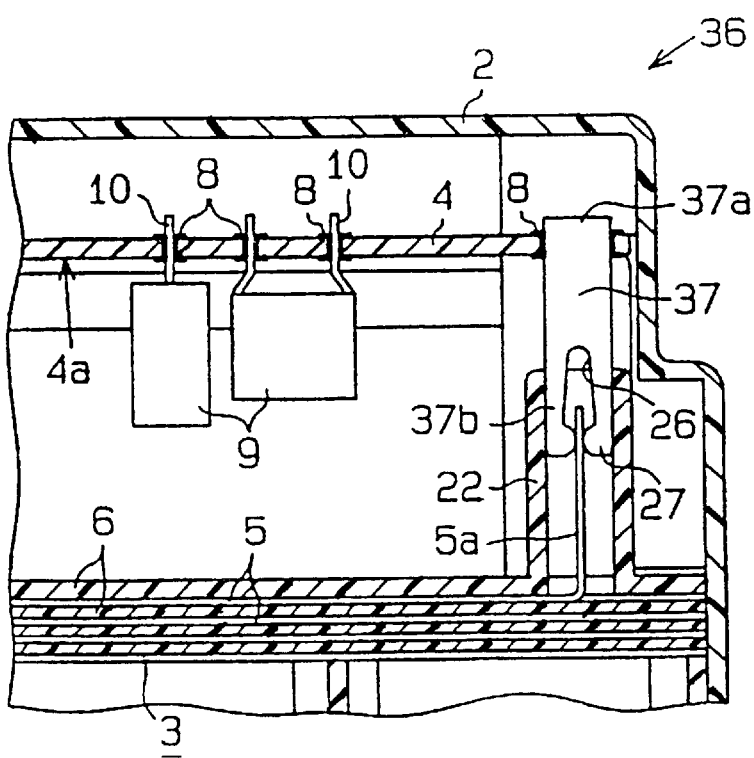
FIG. 6 is a partial sectional view showing yet another embodiment of the electrical connection box of the invention.

The insertion grooves 26 may be provided in the ends 37b of the connecting terminals 37, instead of in the tabs 5a, as shown in the electrical connection box 36 of a third embodiment which is shown in FIG. 6. Wider connecting terminals 37 are used for the formation of the insertion grooves 26, and the plated through-holes 8 where their first ends 37a are inserted in the board 4 are also made correspondingly larger.

Since the housings 22 are not indispensable, they may be omitted and the connection of the tabs 5a with the connecting terminals 13 may be exposed.

The shape of the insertion grooves 26 is not limited to that of the embodiments shown. For example, variations of the shape of the pair of the protrusions 27 and the like are possible.

The printed circuit board 4 is not limited to one having a function as an ECU unit, and boards having other functions may be used.

The housing 22 at the bus bar laminate side 3 need not be integrally molded. Namely, the housings 22 may be separately formed, and may be connected with the insulation layer 6.

The terminals 10 of the electrical parts 9 and the connecting terminals 13 of the connection articles 11 do not necessarily have to be inserted in order to be soldered. For example, pads may be provided on the printed circuit board 4, and the terminals 10 and the connecting terminals 13 may be soldered on the pads according to a surface mounting system.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An electrical connection box comprising:
   a bus bar laminate having at least one bus bar and at least one insulation layer laminated together;
   a printed circuit board; and
   a plurality of connection terminals partially embedded in a molded block of resin material and having first and second ends exposed outside said molded block, the first ends connected by soldering to said printed circuit board, and the second ends remote from said first ends;
   wherein said bus bar laminate has a plurality of connection tabs upstanding from said at least one bus bar; and
   wherein said connection terminals and said connection tabs are directly connected together to establish electrical connection between said bus bar laminate and said printed circuit board, the direct electrical connection between respective ones of said connection terminals and respective ones of said connection tabs being established by insertion grooves respectively provided in one of (i) the respective ones of the connection tabs and (ii) said second ends of the connection terminals, with the other thereof being inserted into and held in said insertion grooves.

2. An electrical connection box according to claim 1, further comprising at least one insulative housing upstanding from said bus bar laminate towards said printed circuit board, each said insulative housing containing a plurality of said connection tabs and having an end remote from said bus bar laminate, said molded block abutting against said remote end.

3. An electrical connection box according to claim 1, wherein each respective connection terminal and each respective connection tab are arranged in respective orthogonal planes at the connection thereof.

4. A vehicle containing at least one electrical connection box, said electrical connection box comprising:
   a bus bar laminate having at least one bus bar and at least one insulation layer laminated together;
   a printed circuit board, and
   a plurality of connection terminals partially embedded in a molded block of resin material and having first and second ends exposed outside said molded block, the first ends connected by soldering to said printed circuit board, and the second ends remote from said first ends;
   wherein said bus bar laminate has a plurality of connection tabs upstanding from said at least one bus bar, and
   wherein said connection terminals and said connection tabs are directly connected together to establish electrical connection between said bus bar laminate and said printed circuit board, the direct electrical connection between respective ones of said connection terminals and respective ones of said connection tabs being established by insertion grooves respectively provided in one of (i) the respective ones of the connection tabs and (ii) said second ends of the connection terminals, with the other thereof being inserted into and held in said insertion grooves.

5. An electrical connection box according to claim 1, wherein said connection tabs comprise bent portions of said at least one bus bar.

6. An electrical connection box according to claim 1, further comprising a pair of opposed protrusions at upper ends of inner sides of said insertion groove.

7. An electrical connection box according to claim 1, wherein each connection terminal includes a bent portion embedded in said resin material.

* * * * *